(12) United States Patent  
Reed

(10) Patent No.: US 9,024,828 B2  
(45) Date of Patent: May 5, 2015

(54) THREE DIMENSIONAL OVER THE AIR ANTENNA PERFORMANCE EVALUATION

(71) Applicant: Spirent Communications, Inc., Sunnyvale, CA (US)

(72) Inventor: John Douglas Reed, Arlington, TX (US)

(73) Assignee: Spirent Communications, Inc., Sunnyvale, CA (US)

( * ) Notice: Subject to any disclaimer, the term of this patent is extended or adjusted under 35 U.S.C. 154(b) by 136 days.

(21) Appl. No.: 13/753,138

(22) Filed: Jan. 29, 2013

(65) Prior Publication Data

US 2013/0300616 A1 Nov. 14, 2013

Related U.S. Application Data

(60) Provisional application No. 61/644,984, filed on May 9, 2012.

(51) Int. Cl.
*G01R 29/10* (2006.01)
*H04B 17/00* (2006.01)

(52) U.S. Cl.
CPC ............ *G01R 29/10* (2013.01); *H04B 17/0032* (2013.01); *H04B 17/0095* (2013.01)

(58) Field of Classification Search
USPC .............................. 343/703; 455/67.11, 67.12
See application file for complete search history.

(56) References Cited

U.S. PATENT DOCUMENTS

| | | | |
|---|---|---|---|
| 5,548,820 A | 8/1996 | Victorin | |
| 6,236,363 B1 | 5/2001 | Robbins et al. | |
| 6,349,218 B1 | 2/2002 | Nakagawa et al. | |
| 6,571,082 B1 | 5/2003 | Rahman et al. | |
| 6,952,455 B1 | 10/2005 | Banister | |
| 7,508,868 B2 | 3/2009 | Chang | |
| 7,715,844 B2 | 5/2010 | Bi et al. | |
| 8,412,112 B2* | 4/2013 | Foegelle | 455/67.12 |
| 8,793,093 B2* | 7/2014 | Mow et al. | 702/108 |
| 2003/0050020 A1 | 3/2003 | Erceg et al. | |
| 2003/0124982 A1 | 7/2003 | Saari et al. | |
| 2004/0259554 A1 | 12/2004 | Rappaport et al. | |
| 2006/0229020 A1 | 10/2006 | Mlinarsky et al. | |
| 2007/0243826 A1 | 10/2007 | Liu | |
| 2008/0056340 A1 | 3/2008 | Foegelle | |

(Continued)

OTHER PUBLICATIONS

Rumney, Moray, "LTE and the Evolution to 4G Wireless: Design and Measurement Challenges," Agilent Technologies Publication, 2009, pp. 199-411.

(Continued)

*Primary Examiner* — Tan Ho
(74) *Attorney, Agent, or Firm* — Haynes Beffel & Wolfeld LLP; Ernest J. Beffel, Jr.

(57) ABSTRACT

A method of emulating real world conditions of a radio frequency (RF) signal reaching a device-under-test (DUT) includes exposing the DUT to a cone of RF signal angles of arrival transmitting coordinated RF signals from an antenna array. The antenna array has at least one antenna located at a center of the antenna array and at least three antennas located at substantially equal distance from the center and from each other. Such configuration of the antennas in the antenna array defines a base of the cone to have a range of angles of 20° to 70°. The cone of RF signal angles of arrival and the DUT may be enclosed in a chamber such as an anechoic chamber. The method sets an azimuth angle and/or an elevation angle of the DUT with respect to the transmitted RF signals.

30 Claims, 10 Drawing Sheets

(56) References Cited

U.S. PATENT DOCUMENTS

| | | | |
|---|---|---|---|
| 2008/0139195 | A1 | 6/2008 | Marsyla et al. |
| 2009/0094492 | A1 | 4/2009 | Music et al. |
| 2011/0084887 | A1* | 4/2011 | Mow et al. .................... 343/703 |
| 2012/0098713 | A1* | 4/2012 | Mow et al. .................... 343/703 |
| 2012/0225624 | A1* | 9/2012 | Kyosti et al. ............... 455/67.11 |
| 2012/0282863 | A1* | 11/2012 | Guo et al. ................. 455/67.12 |

OTHER PUBLICATIONS

"Moving Forward to What's Possible in LTE," Agilent Technologies, Inc., Mar. 16, 2009, pp. 1-12, accessed at http://www.agilent.com/find/lte.

"Agilent 3GPP Long Term Evolution: System Overview, Product Development, and Test Challenges," Application Note, Agilent Technologies, Inc., Sep. 8, 2009, pp. 1-92, accessed at http://www.agilent.com/find/LTE.

"E6620 Wireless Communications Test Set," Agilent Technologies, Inc., Jun. 8, 2009, pp. 1-12, accessed at http://www.agilent.com/find/8960devicedesign.

Technical White Paper, "Long Term Evolution (LTE): A Technical Overview," Motorola, Inc., 2007, pp. 1-15, accessed at www.motorola.com.

Narandzic, Milan et al., "Comparison of SCM, SCME, and WINNER Channel Models," IEEE, 2007, pp. 413-417.

International Search Report mailed Aug. 2, 2010 in PCT/US2010/024204, pp. 1-3.

* cited by examiner tetrahedron cube octahedron dodecahedron

THREE DIMENSIONAL OVER THE AIR ANTENNA PERFORMANCE EVALUATION

RELATED APPLICATIONS

This application claims benefit of U.S. Provisional Patent Application No. 61/644,984, filed 9 May 2012, which application is incorporated by reference as if fully set forth herein.

This application is related to U.S. patent application Ser. No. 13/147,579, filed Feb. 13, 2010, entitled "Emulation and Controlled Testing of MIMO OTA Channels" and to U.S. patent application Ser. No. 12/625,180, filed Nov. 24, 2009, entitled "Methods and Systems for Testing Cell Phones with Multiple Antennas". The related applications are incorporated by reference.

BACKGROUND

The technology disclosed relates to lab based over-the-air (OTA) testing of multiple antenna devices, and more particularly to techniques for OTA testing suitable for producing a test signal to emulate a wireless channel while using a limited number of transmit elements.

When designing over-the-air (OTA) testing approaches, channel modeling concepts are applied in order to insure that the received signal is representative of the desired test condition. Modern radio systems use different technologies including spread spectrum techniques such as wide-band code division multiple access (WCDMA), and orthogonal frequency division multiple access (OFDMA). These two technologies are significantly different in the way they process the received signal, leading to differences in how the RF channel is modeled. This impacts the design of an OTA test.

For wide band radio systems, the multi-path radio channel can be modeled as a series of delayed copies of the signal. For spread spectrum systems, such as WCDMA, each delayed copy of the signal that is resolvable within the radio bandwidth is called a path, and is typically characterized by a narrow angle spread. Each path is detected and may be processed or combined in a manner determined by the design of the receiver. Thus for this type of air interface, the paths are carefully specified to allow multiple antenna processing to be correctly emulated.

Use of predefined channel models can be used to define an OTA test. Recorded signals obtained from channel measurements can also be used in a play-back fashion to generate test signals.

Generating the test signals for an over-the-air test is complex. There are multiple paths. Each path must be constructed to produce the proper angle of arrival and angle spread in order to produce the proper correlation between antennas at the device-under-test. Thus, many individual transmit elements (also referred to as probes herein) would typically be required to be located in a variety of positions within an anechoic chamber to produce an adequate test signal. Having many probes is costly and complex to implement. Furthermore, having many probes will degrade the characteristics of the chamber due to additional reflections that may be produced.

Therefore, it is desirable to provide techniques for emulating real world conditions of a radio frequency signal reaching a device-under-test.

SUMMARY

A method of emulating real world conditions of a radio frequency (RF) signal reaching a device-under-test (DUT) includes exposing the DUT to a cone of RF signal angles of arrival transmitting coordinated RF signals from an antenna array. The antenna array has at least one antenna located at a center of the antenna array and at least three antennas located at substantially equal distance from the center and from each other. Such configuration of the antennas in the antenna array defines a base of the cone to have a range of angles of 20° to 90°. The cone of RF signal angles of arrival and the DUT may be enclosed in a chamber such as an anechoic chamber. The method sets an azimuth angle and/or an elevation angle of the DUT with respect to the transmitted RF signals.

Particular aspects of the technology disclosed are described in the claims, specification and drawings.

DETAILED DESCRIPTION

The following detailed description is made with reference to the figures. Preferred implementations are described to illustrate the technology disclosed, not to limit its scope, which is defined by the claims. Those of ordinary skill in the art will recognize a variety of equivalent variations on the description that follows.

Generating the test signals for an over-the-air (OTA) test to accurately emulate a wireless channel between a transmitter and a receiver is complex. Modern radio systems use different technologies including for example spread spectrum techniques such as wide-band code division multiple access (WCDMA), and orthogonal frequency division multiple access (OFDMA). These two techniques are significantly different in the way they process the received signal, however the modeling and generation of the wireless RF channel in the test environment is the same.

The technology disclosed replaces positioning of cellular signal antennas in a plane (around the base of a test chamber) with an array of antennas that create a cone of angles of arrival for coordinated RF signals. In some implementations, the cone of angles of arrival subtends a solid angle of 20 to 90 degrees. In other implementations, the cone of angles of arrival subtends a solid angle of 30 to 80 degrees. In other implementations, the cone of angles of arrival subtends a solid angle of 40 to 70 degrees. In other implementations, the cone of angles of arrival is configured to subtend a solid angle of at least 65-90 degrees.

Figure 10:
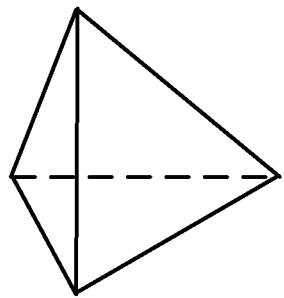
FIG. 10 illustrates example Platonic solids.
Figure 10:
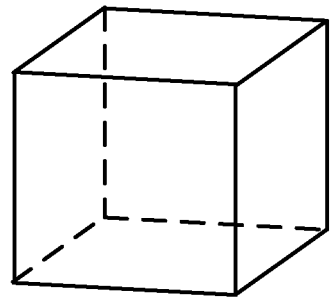
Figure 10:
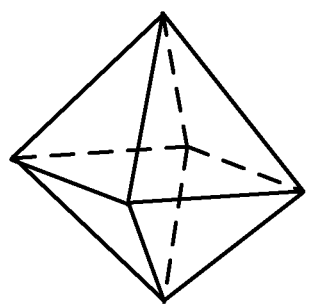
Figure 10:
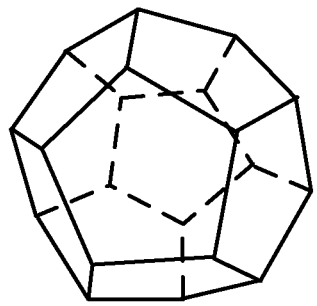

A device under test (DUT) is manipulated to change test orientations between the DUT and signal cone formed by the antenna array. In some test implementations, the DUT is repeatedly oriented toward the signal cone in substantially symmetrical positions distributed over the face of a sphere. These orientations can be symmetrically oriented towards vertices, face centers, or edge midpoints of a Platonic Solid that is one of a tetrahedron (4 vertices, 4 faces, 6 edges), octahedron (6 vertices, 8 faces, 12 edges), cube (8 vertices, 6 faces, 12 edges), icosahedron (12 vertices, 20 faces, 30 edges), and dodecahedron (20 vertices, 12 faces, 30 edges), as illustrated in FIG. 10. Thus a set of possible points for relative orientations in substantially symmetrical positions includes 4, 6, 8, 12, 20 and 30. A variety of other substantial symmetrical orientations towards the signal cone can be achieved. Use of substantially symmetrical orientations will test antenna performance over a three dimensional range of approach angles of the signal cone.

Depending on the geometry of a mount for the DUT, it may be useful to reverse mounting of the DUT during a test, so that geometry of the mount does not interfere with the test.

A controlled three-dimensional distribution of simultaneously received power from various angles of arrival can be accomplished by equal distribution of antennas on a sphere or hemisphere centered on a DUT. Equal distribution of antennas along the base of a cone, namely a section of a sphere centered on the DUT, may provide such distribution as well, without requiring as many antennas.

An array of antennas can be combined with orienting the DUT by setting azimuth angles and elevation angles of the DUT with respect to the transmitted RF signals. Per-orientation performance measurements of the DUT may be measured at each combination of pre-determined azimuth angles and elevation angles. Attributes of the per-orientation performance measures, such as the average, maximum, or minimum, may be obtained to obtain a composite performance measure. Per-orientation performance measurements of the DUT may be repeated for more than one orientation to obtain equal samplings equivalent to those that may be measured from equal distribution of antennas on a sphere without changing the orientation of the DUT.

The present technology includes a method of emulating real world conditions of a radio frequency (RF) signal reaching a device-under-test (DUT). The method includes exposing the DUT to a cone of RF signal angles of arrival transmitting coordinated RF signals from an antenna array. The antenna array has at least one antenna located at a center of the antenna array and at least three antennas located at substantially equal distance from the center and from each other on a perimeter of the antenna array. When the antenna array has more than three antennas on the perimeter, the antennas on the perimeter are equal distant from its nearest neighbors on the perimeter. Such configuration of the antennas in the antenna array defines a base of the cone to have a range of angles of 20° to 90°. The cone of RF signal angles of arrival and the DUT may be enclosed in a chamber such as an anechoic chamber. The method sets an azimuth angle and/or an elevation angle of the DUT with respect to the transmitted RF signals. The coordinated RF signals may be unique to each antenna in the antenna array, or may be the same to antennas in the antenna array.

Figure 4A:
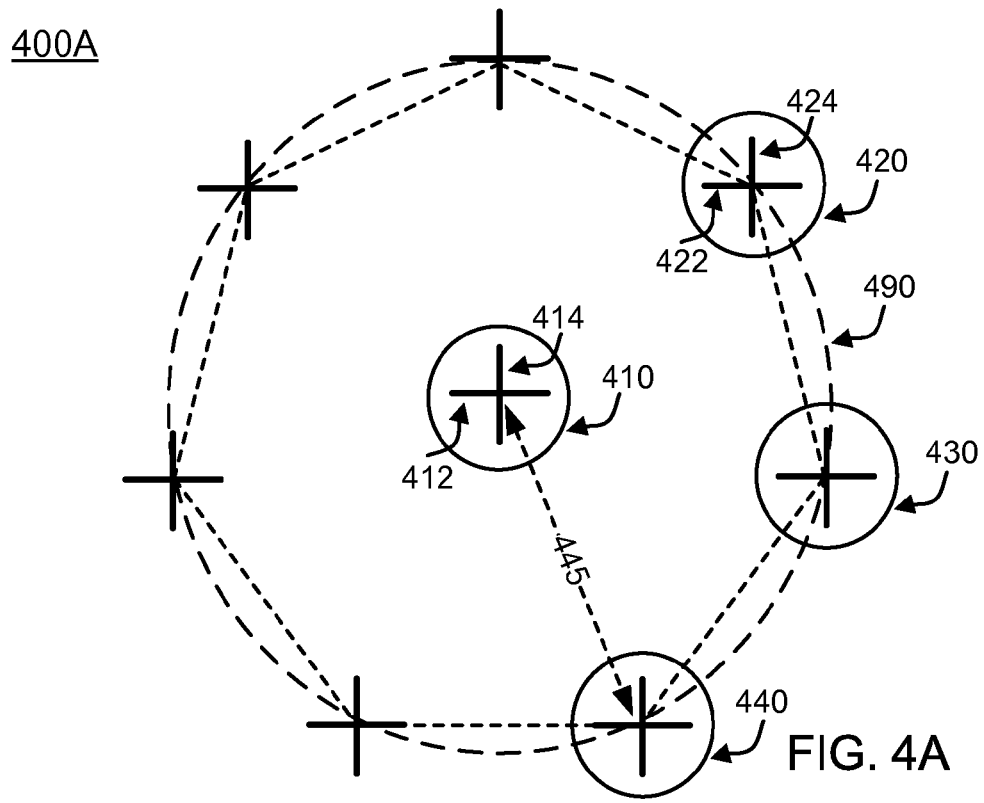
FIG. 4A illustrates the transmitter antenna geometry of an antenna array.

FIG. 4A illustrates the transmitter antenna geometry of an antenna array 400A. The antenna array 400A has at least one center antenna 410 located at a center of the antenna array 400A and at least three perimeter antennas 420, 430, and 440 located at a first distance 445 from the center of the antenna array 400A on a perimeter 490 of the antenna array 400A. In one implementation as shown in FIG. 4A, the antenna array 400A includes eight antennas, including the antenna 410 at the center of the antenna array 400A, and seven other antennas at perimeter antenna locations on the perimeter 490. Each antenna includes two orthogonal antenna elements positioned at each of the center and perimeter antenna locations of the antenna array. A first antenna element of the two orthogonal antenna elements can be a vertical antenna element, and a second antenna element of the two orthogonal antenna elements can be a horizontal antenna element, or vice versa. For instance, the antenna 410 at the center has a vertical element 414 and a horizontal element 412, and the antennas 420 at perimeter antenna locations each have a vertical element 424 and a horizontal element 422. In general, each antenna can include one or more vertical element, and one or more horizontal element. First antenna elements at the perimeter antenna locations can be aligned with each other. Similarly, second antenna elements at the perimeter antenna locations (e.g. 420) can be aligned with each other. Each antenna can also include other elements not parallel to the vertical element or not parallel to the horizontal element.

Figure 4B:
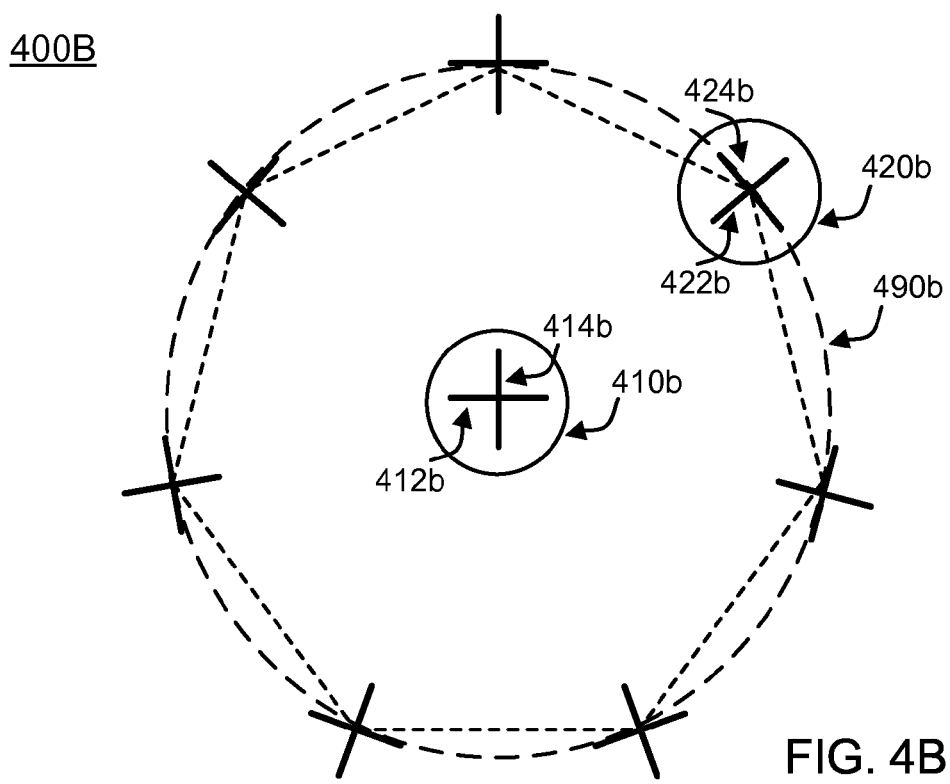
FIG. 4B illustrates the transmitter antenna geometry of an alternative antenna array.

FIG. 4B illustrates the transmitter antenna geometry of an alternative antenna array 400B. The antenna array 400B has at least one antenna 410$b$ located at a center of the antenna array 400B and at least three antennas (e.g. 420$b$) located at substantially equal distance from the center and from each other, on a perimeter 490$b$ of the antenna array 400B. In one implementation as shown in FIG. 4B, the antenna array 400B includes eight antennas, including the antenna 410$b$ at the center of the antenna array 400B, and seven other antennas (e.g. 420$b$) at perimeter antenna locations on the perimeter 490$b$. Each antenna includes two orthogonal antenna elements positioned at each of the center and perimeter antenna locations of the antenna array. For instance, the antenna 410$b$ at the center has a first antenna element 414$b$ and a second antenna element 412$b$, and the antennas 420$b$ at perimeter antenna locations on the perimeter 490$b$ each have a first antenna element 424$b$ and a second antenna element 422$b$. The first antenna element and the second antenna element of an antenna can be orthogonal to each other. In general, each antenna may include one or more first antenna elements, and one or more second antenna elements. In the implementation as shown in FIG. 4B, the first antenna elements of the element pairs of antennas at the perimeter antenna locations are tangential to the perimeter 490$b$.

Figure 5:
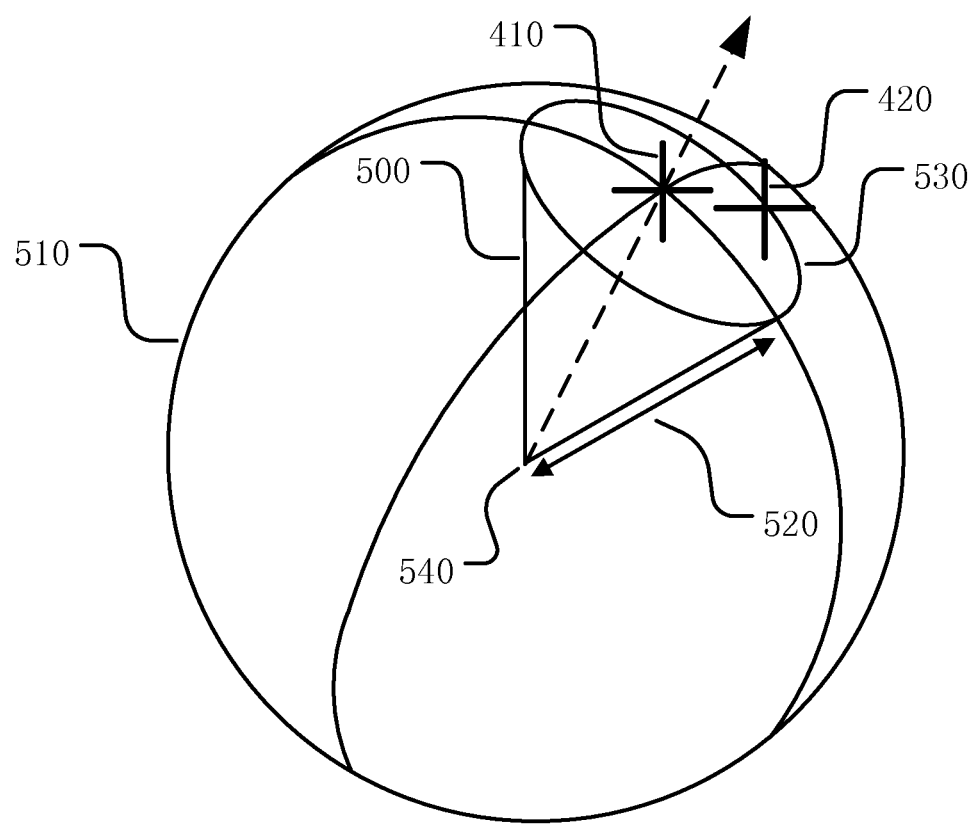
FIG. 5 illustrates a cone of radio frequency signal angles of arrival.

FIG. 5 illustrates a cone of radio frequency (RF) signal angles of arrival transmitting coordinated radio frequency (RF) signals from an antenna array such as the antenna array 400A described in connection with FIG. 4A. Description about FIG. 5 in connection with the antenna array 400A in FIG. 4A is generally applicable to the antenna array 400B in FIG. 4B. As described herein, the antenna array 400A has at least one antenna 410 located at a center of the antenna array 400A and at least three antennas (e.g. 420) located at substantially equal distance from the center and from each other. Such configuration of the antennas in the antenna array 400A defines a base of the cone to have a range of angles of 20° to 90°, 30° to 80°, or 40° to 70°.

As shown in FIG. 5, a cone of RF signals 500 is enclosed within a sphere 510, and tapers along radii 520 of the sphere 510 from a base 530, typically flat and circular, towards an apex 540 which is the center of the sphere 510. The antenna 410 and antenna 420 in FIG. 4A are superimposed on the cone of RF signals 500 in FIG. 5, also representing other antennas in the antenna array 400A.

In operation, a device-under-test (DUT) is at the apex 540 of the cone of RF signals 500. Antennas in the antenna array 400A, such as the antenna 410 and antenna 420, are located on the base 530 of the cone of RF signals 500. At least one antenna is located at the center of the antenna array 400A and at least three antennas are located at substantially equal distances from the center on a perimeter of the antenna array (e.g. 490 in FIG. 4A). When the antenna array has more than three antennas on the perimeter, the antennas on the perimeter are equal distant from its nearest neighbors on the perimeter. The perimeter antennas may be distributed at substantially equal angles around the base of the cone, so that three antennas would be positioned at 0, 120 and 240 degrees for example. The antenna array 400A transmits coordinated RF signals, which reach the DUT at varying angles of arrival (AoA), depending at least on locations of antennas in the antenna array 400A.

Figure 6:
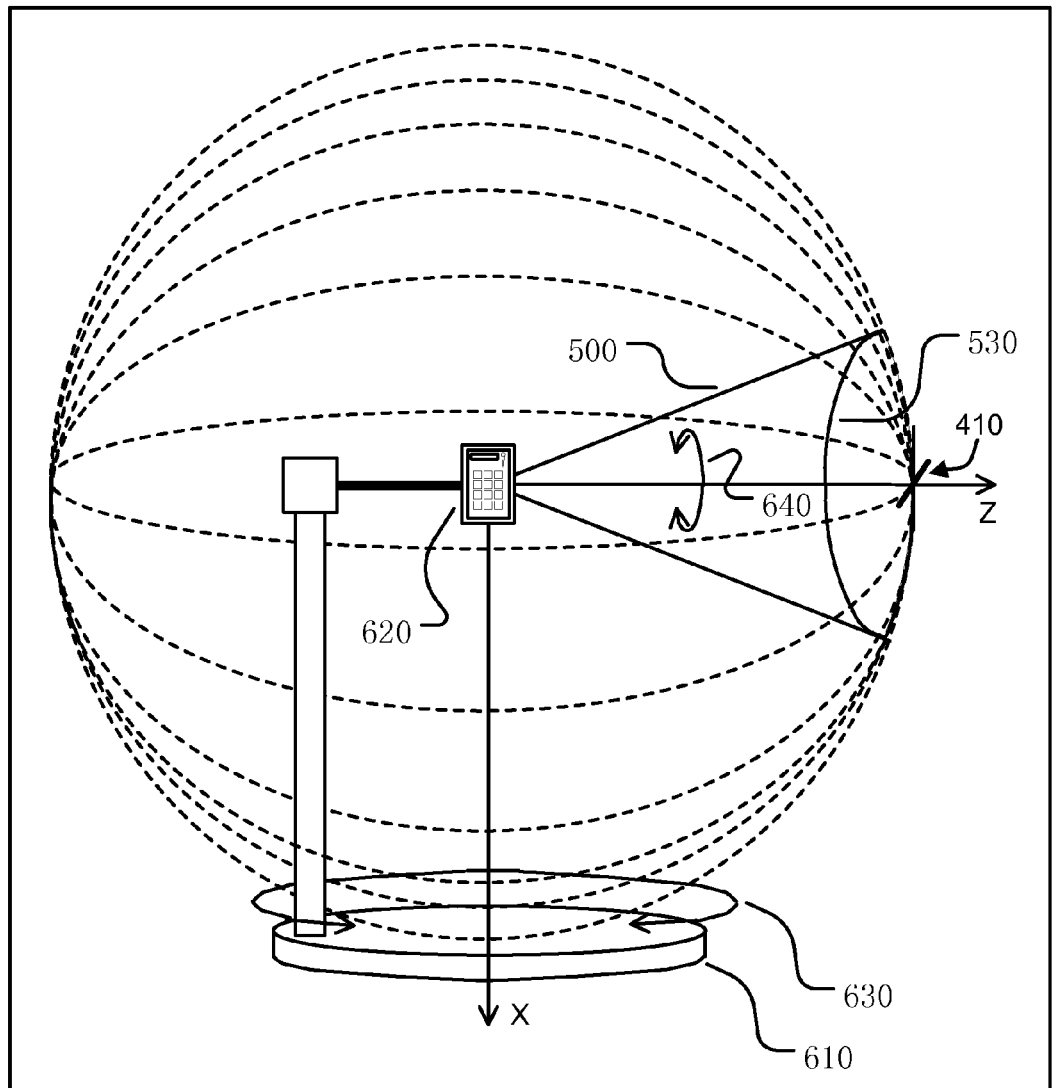
FIGS. 6-7 illustrate a device that emulates real world conditions of a radio frequency (RF) signal reaching a device-under-test (DUT).
Figure 6:
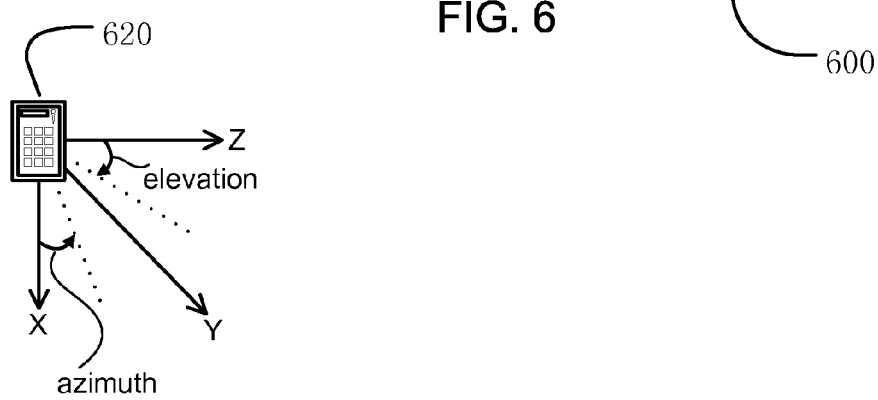
Figure 7:
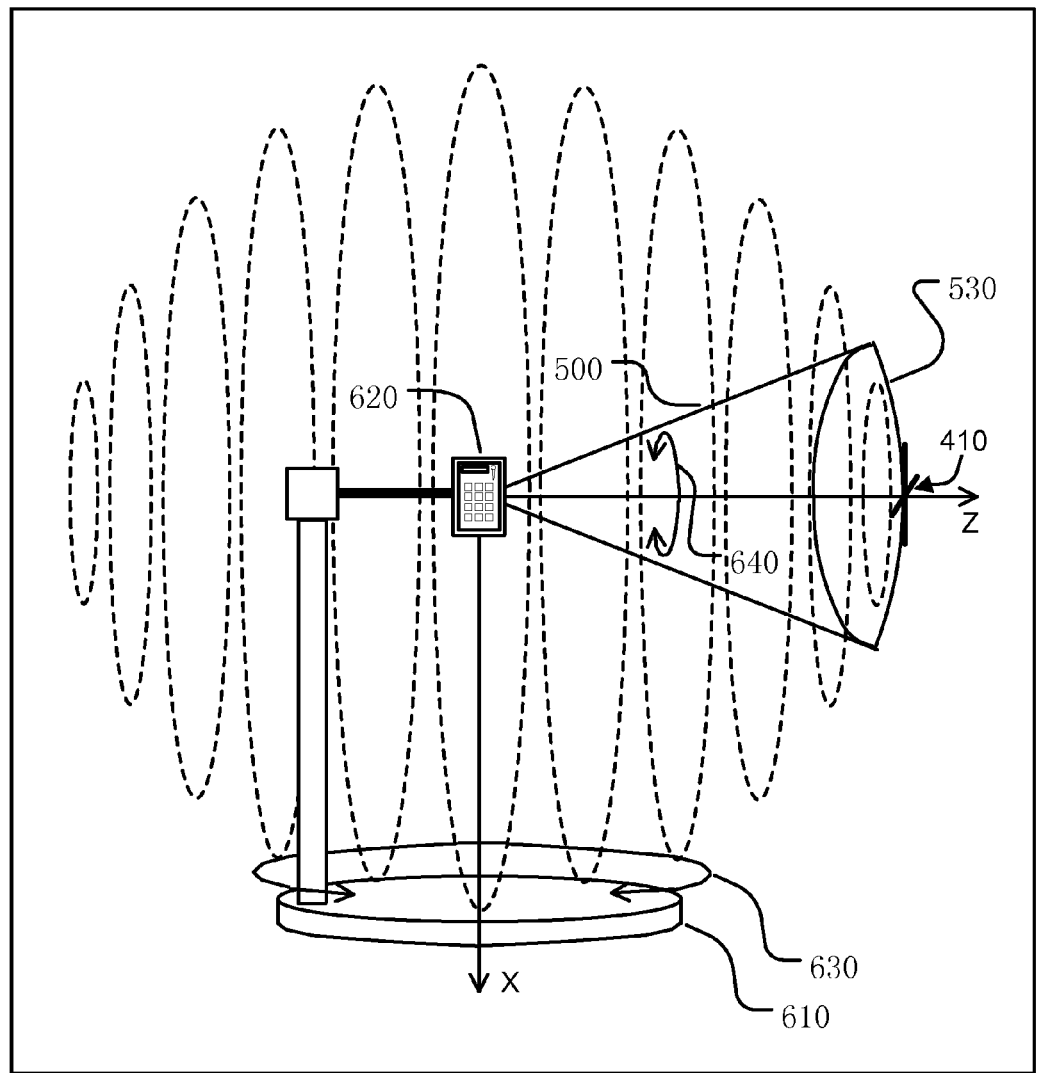
Figure 7:
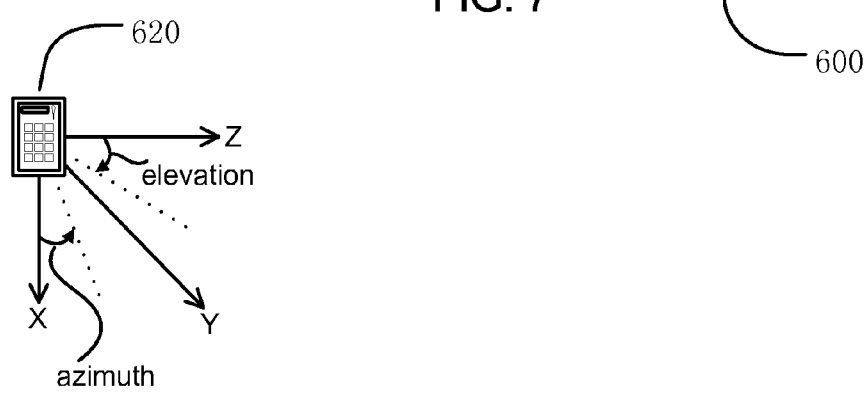

FIGS. 6-7 illustrate a device that emulates real world conditions of a radio frequency (RF) signal reaching a device-under-test (DUT). The device includes a chamber 600 to enclose a DUT 620 exposed to a cone of RF signals 500 from an antenna array transmitting coordinated RF signals. The antenna array (e.g. 400A in FIG. 4A) has at least one center antenna 410 at a center of the antenna array and at least three perimeter antennas (e.g. 420, 421, 422 in FIG. 4A) located at a first distance (e.g. 440 in FIG. 4A) from the center of the antenna array. The center and the perimeter antennas defining a base 530 of the cone of RF signals 500 having a range of angles of 20° to 90° relative to the DUT 620.

As illustrated in FIGS. 6-7, a two-axis positioner 610 is used to set the orientation of the DUT 620. Either the position of the antenna array or the orientation of the device under test can be changed to vary the relative orientation of the DUT 620 to the cone of RF signals 500. As described herein, a number of relative orientations in substantially symmetrical positions relates to the vertices, face centers, or edge midpoints of a Platonic Solid, which includes 4, 6, 8, 12, 20, and 30 orientations that substantially cover the surface area of the sphere 510. If a different number, such as 5, is used, the orientations can only be substantially symmetrical, which will provide substantially three-dimensional testing.

As illustrated in FIGS. 6-7, the method sets an azimuth angle and/or an elevation angle of the DUT 620 with respect to the transmitted RF signals, using a two-axis positioner 610. The azimuth angle is in an X-Y plane, and the elevation angle is in an Y-Z plane. In the X-Y plane, the two-axis positioner 610 makes a X-Y rotation 640. In the Y-Z plane, the two-axis positioner 610 makes a Y-Z rotation 630. The X-Y rotation 640 and the Y-Z rotation 630 combine to provide a three-dimensional field of view for the DUT 620.

In addition to testing response to an RF signal cone of arrival angles, additional signals can be transmitted to the DUT from other orientations. Multiple cones of arrival angles can be constructed or other signals can arrive from single antennas.

A test scenario would be generally to set up a call using a base station emulator (such as a Spirent E2010s) coupled to a channel emulator (such as a Spirent VR5), which is set up according to a MIMO (multiple-input-multiple-output) transmission mode with a fading channel having powers set according to the powers desired for the RF signal antenna probes for a test. Controller software initiates the call over the faded signal which is transmitted over-the-air to the device-under-test (DUT). The DUT receives a series of frames that are transmitted over-the-air to establish the throughput in bits per second during a test interval. Several test transmission intervals are measured as the total transmitted power (sum of all antenna probe powers) is dropped a given step size for each measurement. The throughput performance is measured against power level to produce a throughput curve.

A separate noise level may be set by transmitting noise on one or more transmit antennas. In this case, the throughput is measured against a specific signal to noise ratio at the DUT.

RF signals transmitted by the antennas may include Rayleigh fading that is uncorrelated on each vertical and horizontal element of an antenna, and also uncorrelated to the fading signals on other antennas. Noise power may be added, if desired, to the fading signal power to produce a certain signal to noise ratio on each probe. The fading rate may be set according to the three-dimensional geometric relationship between an emulated direction of travel, which is referenced to a given orientation of the Device Under Test, and the three-dimensional angle to the test antenna. The fading rate may be different on each test antenna due to the different angle to the device under test. When the device is reoriented to perform a new test, the fading rate may be adjusted on the test antennas if desired to emulate relative motion of a device to the received signal cone at the reoriented arriving direction. The fading rate may be further characterized by the Doppler spectrum of the RF signal transmitted from each antenna element, having frequency components proportional to the emulated device velocity divided by the wavelength of the RF frequency times the cosine of the angle between the antenna probe and the emulated direction of travel.

Figure 8:
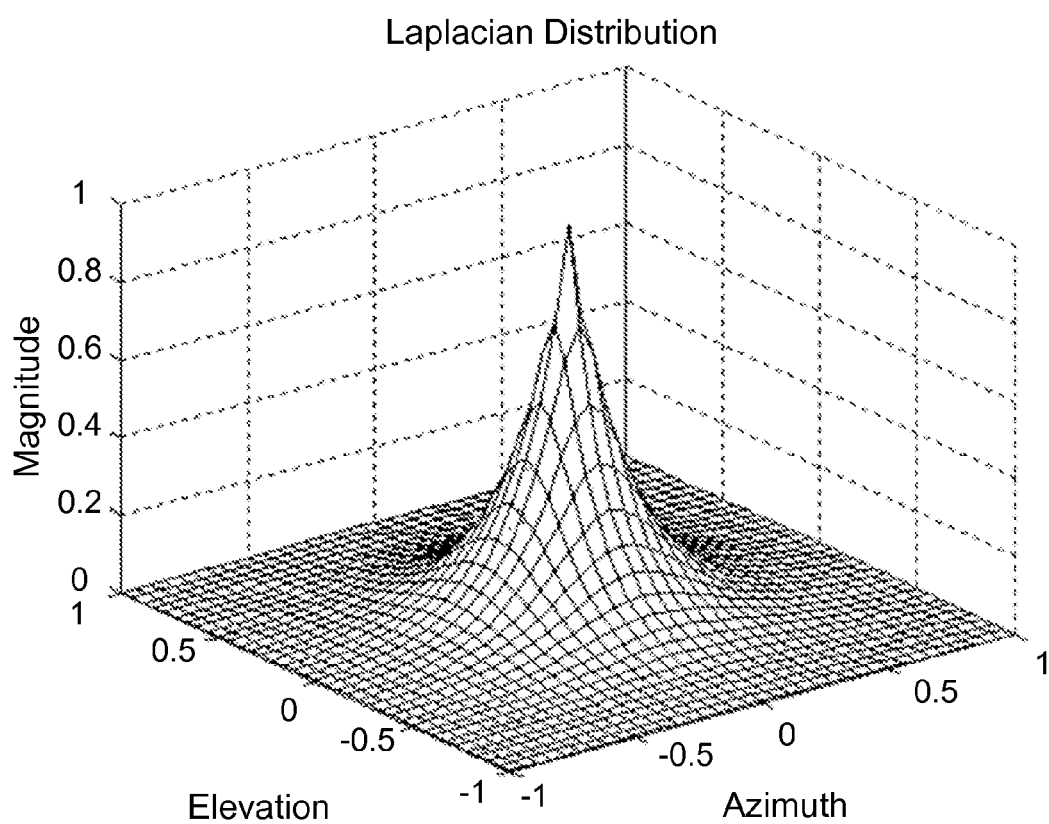
FIG. 8 illustrates a two-dimensional Laplacian function representing the power angle spectrum of a composite radio frequency signal.

FIG. 8 illustrates a two-dimensional Laplacian function representing the power angle spectrum of a composite radio frequency signal in an exponential cone. The average power of the Rayleigh faded signals on each antenna may be set according to a distribution emulating a two-dimensional Laplacian function, such that the center antenna has a higher power than the other antennas, which have equal average powers. The Laplacian is a two sided exponential often used to represent the power angle spectrum of a composite RF signal.

Figure 1:
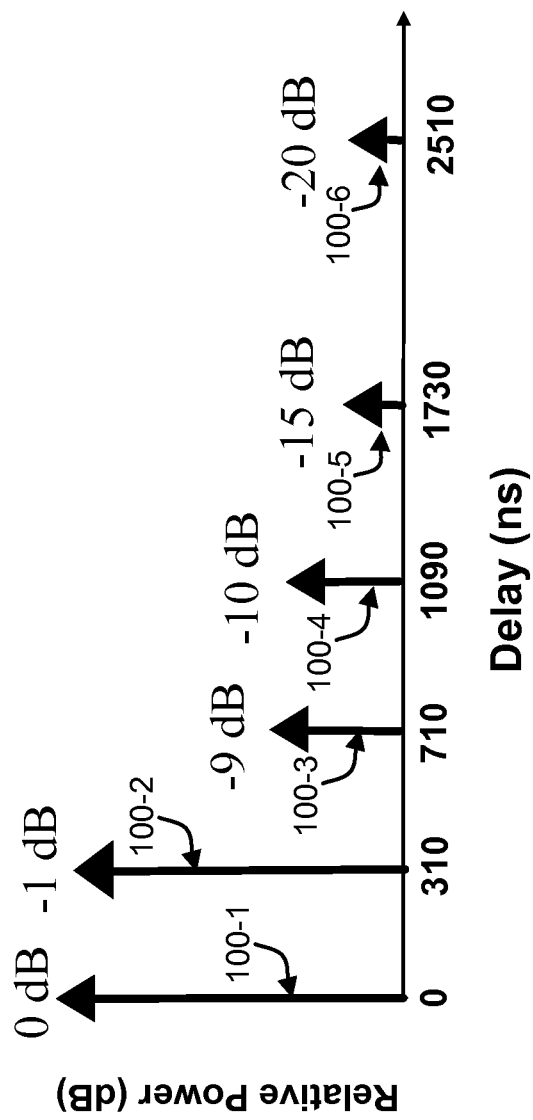
FIG. 1 illustrates an example power delay profile for a wireless channel between a transmitter and a receiver, and is described in the related U.S. patent application Ser. No. 13/147,579 for FIG. 1 therein.
Figure 2:
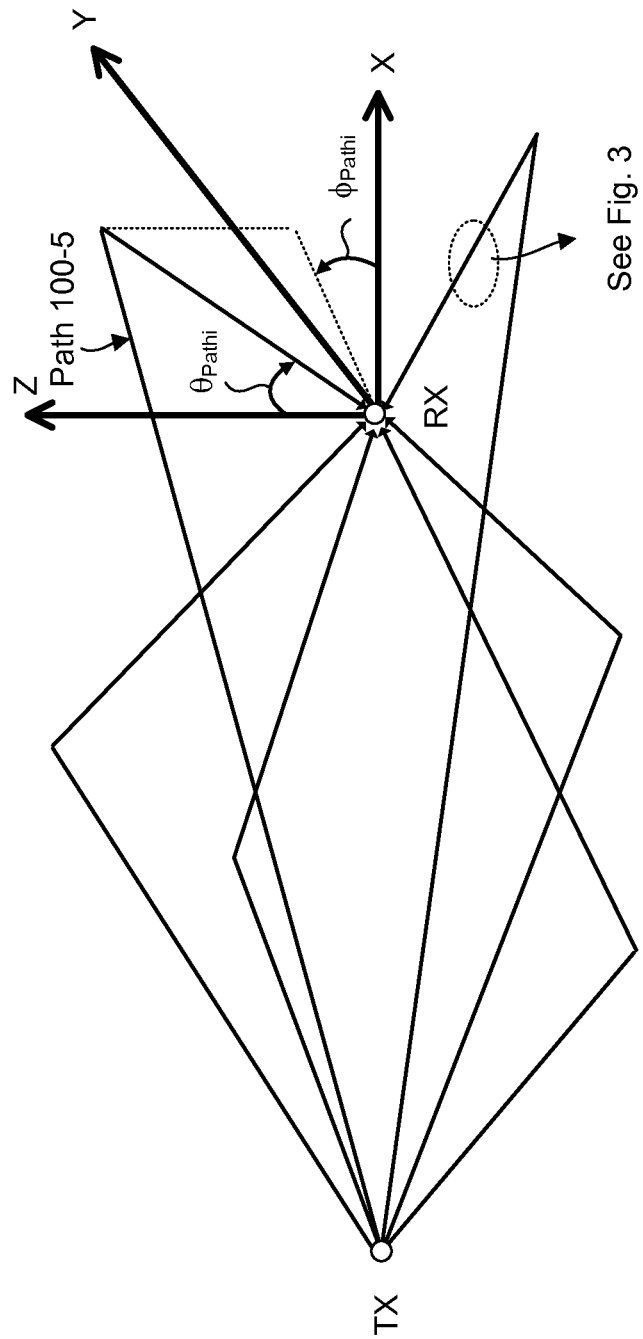
FIG. 2 illustrates a top view of the example wireless channel showing various signal paths, and is described in the related U.S. patent application Ser. No. 13/147,579 for FIG. 2 therein.
Figure 3:
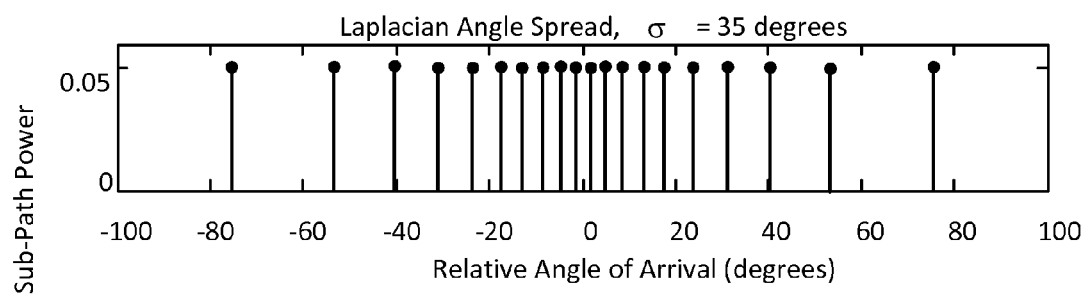
FIG. 3 illustrates an example of emulating a 20 sub-path 35-degree azimuth spread signal path, and is described in the related U.S. patent application Ser. No. 13/147,579 for FIG. 8A therein.

Angle spread is a power weighted "sigma" of the set of angles, and the result of that is less than the range of angles. For example, FIG. 3 has a range of angles of +/−75 degrees, but the angle spread is the sigma, which is 35 degrees. The range of antenna angles (size of the base of the cone) depends on the distribution of powers, but usually exceeds the sigma value.

Figure 9:
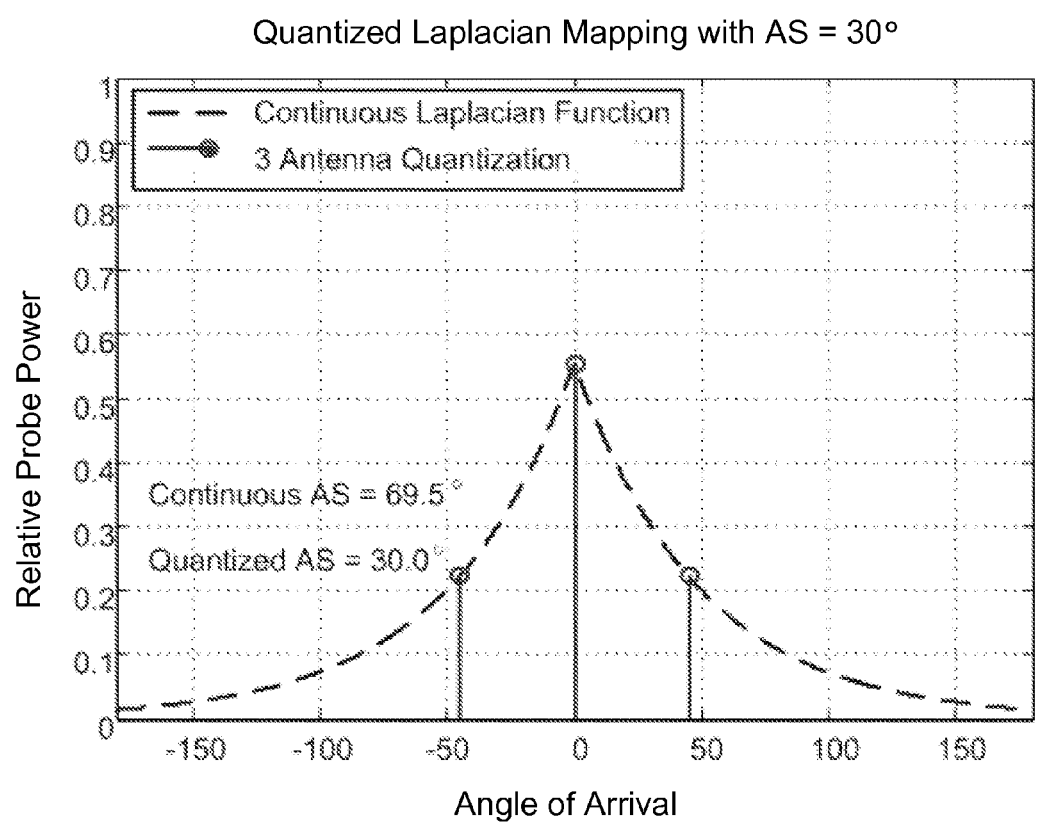
FIG. 9 represents a cross-section of the power angle spectrum in FIG. 8.

FIG. 9 represents a cross-section of the power angle spectrum in FIG. 8. The ratio of the center powers to the power of the edge antennas sets the angle spread of the cone. For the case of the limited number of antennas, the distribution is quantized by the locations and powers of the antenna probes. The angles of the base antennas relative to the apex of the cone represent a positive and negative angle from the center. The angle spread is the second central moment of the normalized power weighted angle profile of the signal cone, defined by a slice through the cone as shown in FIG. 9. FIG. 9 represents a cross section of the cone in FIG. 8, described by three powers consisting of the center antenna power at zero degrees and two edge antenna powers at −45 and +45 degrees in this example. Power ratios are set to produce an angle spread of 30 degrees in this example plot. The powers of all edge antennas may be set to the same value as in this example. Other distributions may be used to define the probe powers, which may include a Gaussian, Uniform, or others. The powers of the antenna probes may be set according to other distributions, such as a different distribution in the azimuth and elevation directions.

It is envisioned that positioning of a source probe array of antennas may be considered instead of positioning the device-under-test, or a combination may be used, e.g. having a one-axis positioner to position the azimuth of the device under test, and an elevation positioner that adjusts the elevation angle of the source probe array of antennas with respect to the device-under-test.

While the technology disclosed is disclosed by reference to the implementations and examples detailed above, it is understood that these examples are intended in an illustrative rather than in a limiting sense. Computer-assisted processing is implicated in the described implementations. Accordingly, the technology disclosed may be implemented in methods for emulating real world conditions of a radio frequency signal reaching a device-under-test, systems including logic and resources to carry out emulating real world conditions of a radio frequency signal reaching a device-under-test, systems that take advantage of computer-assisted emulating real world conditions of a radio frequency signal reaching a device-under-test, media impressed with logic to carry out emulating real world conditions of a radio frequency signal reaching a device-under-test, data streams impressed with logic to carry out emulating real world conditions of a radio frequency signal reaching a device-under-test, or computer-accessible services that carry out computer-assisted emulating real world conditions of a radio frequency signal reaching a device-under-test. It is contemplated that modifications and combinations will readily occur to those skilled in the art, which modifications and combinations will be within the spirit of the technology disclosed and the scope of the following claims.

We claim as follows:

1. A method of emulating real world conditions of a radio frequency (RF) signal reaching a device-under-test (DUT), including:
    exposing a DUT inside a chamber to a cone of RF signals by transmitting coordinated RF signals from an antenna array that has at least one center antenna located at a center antenna location of the antenna array and at least three perimeter antennas located at perimeter antenna locations a first distance from the center of the antenna array, the center and the perimeter antennas defining a base of the cone having a range of angles of 20° to 90° relative to the DUT.

2. The method of claim 1, wherein the perimeter antennas are spread at approximately equal angles around the base of the cone.

3. The method of claim 1, further including adjusting angles in the range of angles or adjusting the first distance.

4. The method of claim 1, wherein the chamber is substantially anechoic to the RF signals.

5. The method of claim 1, further including repeatedly varying an orientation of the DUT to the antenna array to measure response of the DUT to the cone of RF signals from varying three-dimensional angles of approach.

6. The method of claim 5, wherein the orientations of the DUT to the antenna array are arranged over a sphere in a substantially symmetrical pattern.

7. The method of claim 5, wherein the orientations of the DUT to the antenna array are arranged over a sphere at vertices or face centers or edge midpoints of a Platonic Solid that is one of a tetrahedron, octahedron, cube, icosahedron, and dodecahedron.

8. The method of claim 1, wherein antennas in the antenna array are distributed over a hemisphere within the chamber, and the antenna array position is adjustable within the hemisphere.

9. The method of claim 1, wherein two orthogonal antenna elements are positioned at each of the center and perimeter antenna locations of the antenna array.

10. The method of claim 9, wherein first antenna elements of the two orthogonal antenna elements at the perimeter antenna locations are aligned.

11. The method of claim 9, wherein first antenna elements of the two orthogonal antenna elements at the perimeter antenna locations are tangential to the base of the cone.

12. The method of claim 1, wherein the antenna array includes antennas at five to eight perimeter antenna positions.

13. The method of claim 1, wherein the cone of RF signals subtends a solid angle of 30° to 80° relative to the DUT.

14. The method of claim 1, wherein the cone of RF signals subtends a solid angle of 40° to 70° relative to the DUT.

15. The method of claim 1, wherein the cone of RF signals is configured to subtend a solid angle of at least 65° to 90° relative to the DUT.

16. A device that emulates real world conditions of a radio frequency (RF) signal reaching a device-under-test (DUT), including:
    a chamber to enclose a DUT exposed to a cone of RF signals from an antenna array transmitting coordinated RF signals, wherein the antenna array has at least one center antenna located at a center antenna location of the antenna array and at least three perimeter antennas located at perimeter antenna locations a first distance from the center of the antenna array, the center and the perimeter antennas defining a base of the cone having a range of angles of 20° to 90° relative to the DUT.

17. The device of claim 16, wherein the perimeter antennas are spread at approximately equal angles around the base of the cone.

18. The device of claim 16, wherein angles in the range of angles are adjustable and the first distance is adjustable.

19. The device of claim 16, wherein the chamber is substantially anechoic to the RF signals.

20. The device of claim 16, wherein an orientation of the DUT to the antenna array is repeatedly variable for measuring response of the DUT to the cone of RF signals from varying three-dimensional angles of approach.

21. The device of claim 20, wherein the orientations of the DUT to the antenna array are arranged over a sphere in a substantially symmetrical pattern.

22. The device of claim 20, wherein the orientations of the DUT to the antenna array are arranged over a sphere at vertices or face centers or edge midpoints of a Platonic Solid that is one of a tetrahedron, octahedron, cube, icosahedron, and dodecahedron.

23. The device of claim 16, wherein antennas in the antenna array are distributed over a hemisphere within the chamber, and the antenna array position is adjustable within the hemisphere.

24. The device of claim 16, wherein two orthogonal antenna elements are positioned at each of the center and perimeter antenna locations of the antenna array.

25. The device of claim 24, wherein first antenna elements of the two orthogonal antenna elements at the perimeter antenna locations are aligned.

26. The device of claim 24, wherein first antenna elements of the two orthogonal antenna elements at the perimeter antenna locations are tangential to the base of the cone.

27. The device of claim 16, wherein the antenna array includes antennas at five to eight perimeter antenna positions.

28. The device of claim 16, wherein the cone of RF signals subtends a solid angle of 30° to 80° relative to the DUT.

29. The device of claim 16, wherein the cone of RF signals subtends a solid angle of 40° to 70° relative to the DUT.

30. The device of claim 16, wherein the cone of RF signals is configured to subtend a solid angle of at least 65° to 90° relative to the DUT.

* * * * *